(12) United States Patent
Khuat Duy

(10) Patent No.: US 8,610,898 B2
(45) Date of Patent: Dec. 17, 2013

(54) SELF-REFERENCING INTERFEROMETER, ALIGNMENT SYSTEM, AND LITHOGRAPHIC APPARATUS

(75) Inventor: Laurent Khuat Duy, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 307 days.

(21) Appl. No.: 13/207,097

(22) Filed: Aug. 10, 2011

(65) Prior Publication Data

US 2012/0057171 A1    Mar. 8, 2012

Related U.S. Application Data

(60) Provisional application No. 61/380,968, filed on Sep. 8, 2010, provisional application No. 61/380,974, filed on Sep. 8, 2010.

(51) Int. Cl.
*G01B 9/02* (2006.01)

(52) U.S. Cl.
USPC ............................................ 356/494; 356/509

(58) Field of Classification Search
USPC .................................. 356/494, 488, 509, 521
See application file for complete search history.

(56) References Cited

U.S. PATENT DOCUMENTS

| | | | |
|---|---|---|---|
| 5,525,808 A | 6/1996 | Irie et al. | |
| 6,469,793 B1 * | 10/2002 | Stanton | 356/521 |
| 6,507,388 B2 | 1/2003 | Burghoorn | |
| 6,919,561 B2 * | 7/2005 | Lee et al. | 250/237 G |
| 6,961,116 B2 | 11/2005 | Den Boef et al. | |
| 8,054,472 B2 | 11/2011 | Shibazaki | |
| 8,139,219 B2 | 3/2012 | George | |
| 8,305,555 B2 | 11/2012 | Koga et al. | |
| 2001/0006413 A1 | 7/2001 | Burghoorn | |
| 2004/0033426 A1 | 2/2004 | Den Boef et al. | |
| 2004/0066518 A1 * | 4/2004 | Kreuzer | 356/509 |

FOREIGN PATENT DOCUMENTS

| | | |
|---|---|---|
| EP | 1 372 040 A1 | 12/2003 |
| JP | 60-186845 | 9/1985 |
| JP | 62-089328 | 4/1987 |
| JP | 09-306801 | 11/1997 |
| JP | 10-022218 | 1/1998 |

(Continued)

OTHER PUBLICATIONS

U.S. Office Action dated Mar. 20, 2013 in corresponding U.S. Appl. No. 13/207,123.

(Continued)

*Primary Examiner* — Michael A Lyons
*Assistant Examiner* — Jonathan Hansen
(74) *Attorney, Agent, or Firm* — Pillsbury Winthrop Shaw Pittman LLP

(57) ABSTRACT

A self-referencing interferometer includes an optical system to split an alignment beam to create a reference beam and a transformed beam. The optical system includes a beam splitter to combine the reference beam and the transformed beam so that the diffraction orders in the reference beam spatially overlap with their respective opposite orders in the transformed beam. A detector system receives the spatially overlapping reference beam and transformed beam from the optical system and determines a position signal. The detector system includes a polarizing system for manipulating the polarization of the beams so that they interfere, and for directing the interfering reference beam and transformed beam to a detector for determining a position signal from the variation of intensity of the interfering beams.

19 Claims, 10 Drawing Sheets

(56) References Cited

FOREIGN PATENT DOCUMENTS

| | | |
|---|---|---|
| JP | 10-050600 | 2/1998 |
| JP | 2001-077012 | 3/2001 |
| JP | 2004-014758 | 1/2004 |
| JP | 2008-300880 | 12/2008 |
| KR | 2001-0070326 | 7/2001 |
| KR | 2003-0095331 | 12/2003 |

OTHER PUBLICATIONS

Korean Office Action mailed Dec. 20, 2012 in corresponding Korean Patent Application No. 10-2011-0091516.

Japanese Office Action mailed Jan. 22, 2013 in corresponding Japanese Patent Application No. 2011-192368.

* cited by examiner

Fig 14a
Fig 14b
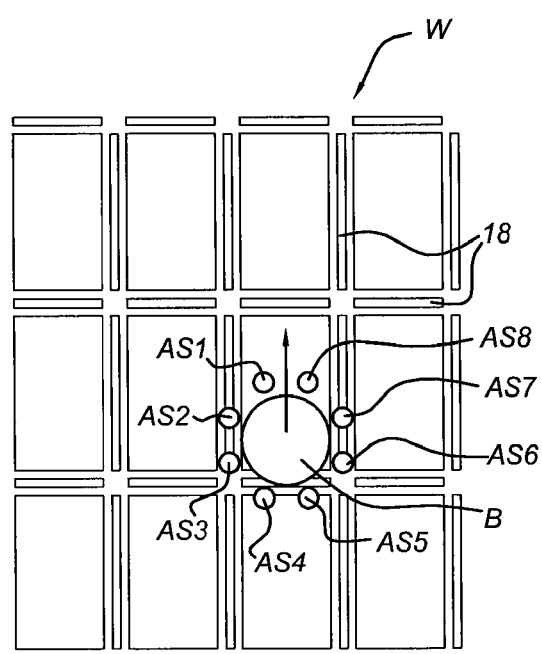
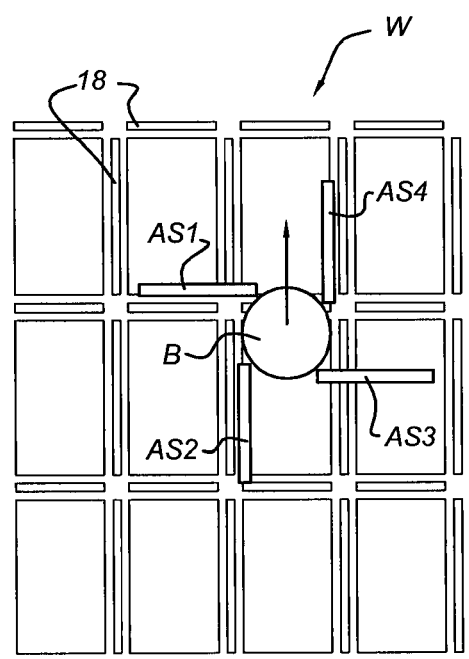

SELF-REFERENCING INTERFEROMETER, ALIGNMENT SYSTEM, AND LITHOGRAPHIC APPARATUS

CROSS-REFERENCE TO RELATED APPLICATION

This application claims priority and benefit under 35 U.S.C. §119(e) to U.S. Provisional Patent Application No. 61/380,968, entitled "Self-Referencing Interferometer, Alignment System, and Lithographic Apparatus," filed on Sep. 8, 2010, and to U.S. Provisional Patent Application No. 61/380,974, entitled "Lithographic Apparatus, Device Manufacturing Method, and Method Of Applying A Pattern To A Substrate," filed on Sep. 8, 2010. The contents of those applications are incorporated herein in their entirety by reference.

FIELD

The present invention relates to a self-referencing interferometer, an alignment system provided with a self-referencing interferometer and a lithographic apparatus provided with such an alignment system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

To ensure that the pattern of a patterning device is transferred onto the correct target position on a substrate, it is important that the substrate is accurately aligned with respect to the lithographic apparatus. Especially in the manufacturing of ICs, which usually contain many individual layers (e.g., 30 layers), it is extremely important that the several individual layers are lined up with respect to each other very accurately. When the line up of the individual layers of an IC is not very accurate the IC might not be an operable IC. Overlay is defined as being the accuracy within which a pattern is imaged on a substrate in relation to the patterns that have previously been imaged on the substrate. As in the manufacture of ICs ever smaller features are imaged, the overlay requirements and hence the necessary accuracy of the alignment process, become stricter.

Lithographic apparatus are known to use multiple alignment systems to align the substrate with respect to the lithographic apparatus. Reference is made in particular to the European patent application EP 1 372 040 A1, which document is hereby incorporated by reference. EP 1 372 040 A1 describes an alignment system using a self-referencing interferometer that produces two overlapping images of an alignment marker. These two images are rotated over 180° with respect to each other. EP 1 372 040 A1 further describes the detection of the intensity variation of the interfering Fourier transforms of these two images in a pupil plane. These intensity variations correspond to a phase difference between different diffraction orders of the two images, and from this phase difference positional information is derived, which is required for the alignment process.

A disadvantage of the known alignment system is that the self-referencing interferometer in the alignment measurement system may be relatively expensive as its optical design requires the use of specially manufactured optical components. A further disadvantage of the known alignment system is that the known self-referencing interferometer is usually quite bulky. This bulkiness may cause unwanted side-effects in the alignment process, such as low bandwidth vibrations modes that can impede the accuracy of the alignment process.

SUMMARY

It is desirable to provide an alternative alignment system which at least partly obviates one or more of above-described disadvantages of the known alignment system. In particular, it is desirable to provide an alignment system an alternative self-referencing interferometer, which may be cheaper and/or more compact. Moreover, embodiments of the present invention relate to a self-referencing interferometer, an alignment system, and a lithographic apparatus.

According to a first aspect a self-referencing interferometer is provided to be used with a mark such as an alignment mark and a lithographic apparatus, the self-referencing interferometer comprising:

an optical arrangement (OPT) for creating a reference beam and a transformed beam from an alignment beam (AB), for outputting to a detector (DET) said reference beam and said transformed beam, for directing an alignment beam (AB) onto a mark (WM) and for capturing a diffracted beam resulting from diffraction of the alignment beam by the mark, wherein the diffracted beam comprises at least one positive diffraction order and at least one corresponding negative diffraction order; the optical arrangement comprising a beam splitter (40) for splitting the diffracted beam into a first beam and a second beam, and for combining and outputting to said detector (DET) said reference beam and said transformed beam so that the diffraction orders in said reference beam spatially overlap with their corresponding opposite diffraction orders in said transformed beam;

a referencing system (10, 11) for creating said reference beam from the first beam and for directing said reference beam to the beam splitter (40);

a transforming system (30, 31, 32, 60, 41, 10, 11) for transforming the second beam into said transformed beam and for directing said transformed beam to the beam splitter (40); and a detector system (DET) for receiving the spatially overlapping reference beam and transformed beam from the optical arrangement (OPT), and for determining a position signal, the detector system comprising:

a polarizing system (80, 81, 83, 86) for manipulating the polarization of the reference beam and the transformed beam so that they interfere with each other, and for directing the interfering reference beam and transformed beam to a detector thereby forming an interference pattern; and a detector (82, 92) for determining a position signal from the interference pattern.

According to another aspect of an embodiment of the invention an alignment system is provided comprising at least one self-referencing interferometer as described above.

According to another aspect of an embodiment of the invention a lithographic apparatus is provided comprising an alignment system as described above.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 14*a* and FIG. 14*b* illustrate an alignment system with a plurality of a self-referencing interferometers according to the invention.

DETAILED DESCRIPTION

Figure 1:
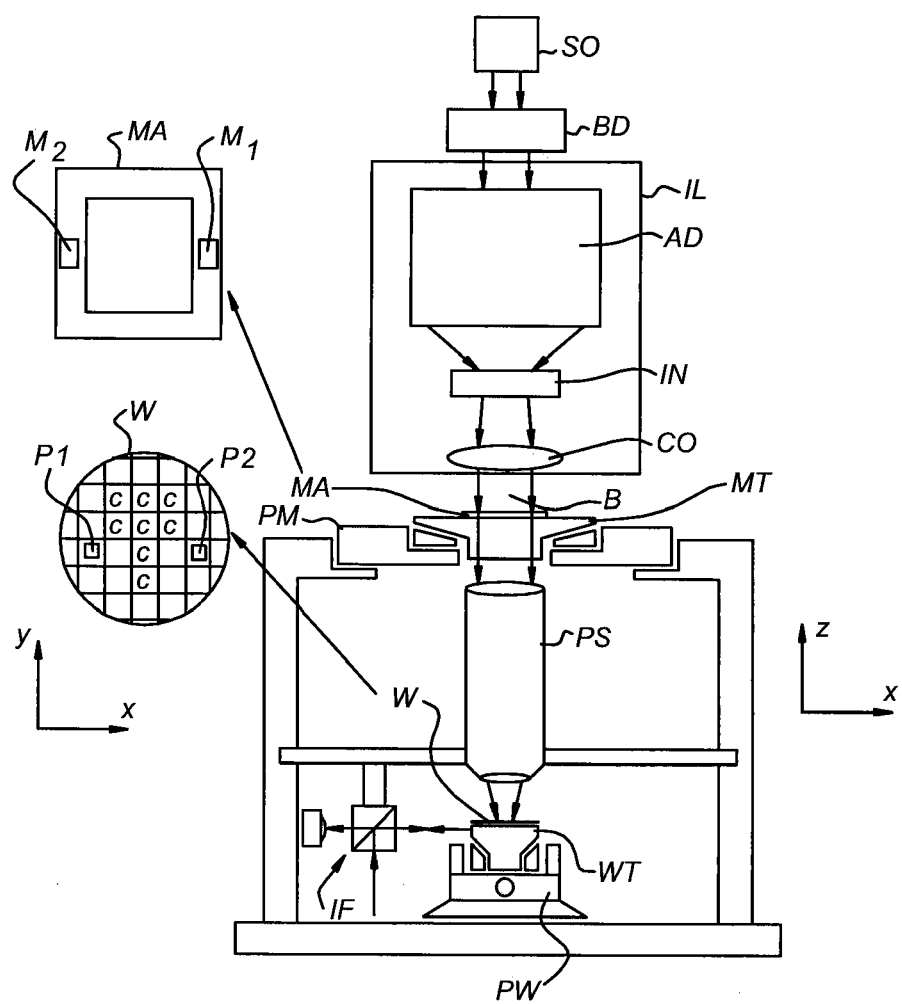
FIG. 1 depicts a lithographic apparatus according to an embodiment of the invention.

FIG. 1 schematically depicts a lithographic apparatus according to an embodiment of the invention. The apparatus comprises:

an illumination system (illuminator) IL configured to condition a radiation beam B (e.g., (D) UV radiation or EUV-radiation).

a support structure (e.g., a mask table) MT constructed to support a patterning device (e.g., a mask) MA and connected to a first positioner PM configured to accurately position the patterning device in accordance with certain parameters;

a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the minor matrix.

The term "projection system" used herein should be broadly interpreted as encompassing any type of projection system, including refractive, reflective, catadioptric, magnetic, electromagnetic, electrostatic optical systems, or other types, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
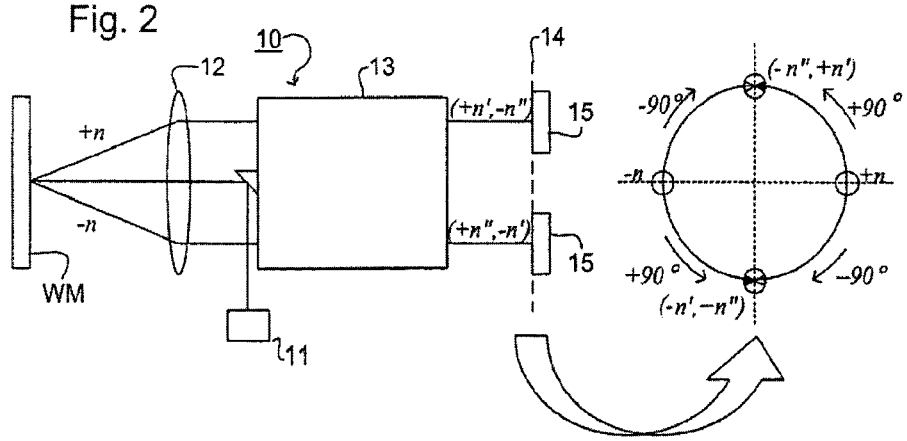
FIG. 2 shows a schematic overview of a known alignment system.

FIG. 2 shows a schematic overview of a known alignment system 10. A light source 11 emits a spatially coherent beam of radiation which illuminates an alignment marker WM on a substrate (e.g., a wafer) which reflects the radiation into positive and negative diffraction orders +n and −n. These diffraction orders are collimated by an objective lens 12 and enter a self-referencing interferometer 13. The self-referencing interferometer outputs two images of the input with a relative rotation of 180° and which overlap and which can therefore be made to interfere. In a pupil plane 14, the overlapping Fourier transforms of these images, with the different diffraction orders separated can be seen and be made to interfere. Detectors 15 in the pupil plane detect the interfered diffraction orders to provide positional information. Based on this positional information a substrate can be aligned accurately with respect to a lithographic apparatus. The right-hand part of FIG. 2 shows the formation of two overlapping images in the pupil plane 14; for one image +n' and −n' are rotated by +90° relative to the input diffraction orders +n and −n; for the other image +n″ and −n″ are rotated by −90° relative to the input diffraction orders +n and −n. In the pupil plane the orders of respectively (+n′ and −n″), and (+n″ and −n′) interfere.

A disadvantage of the known alignment system is that especially the known self-referencing interferometer may be relatively expensive as its optical design can require the use of specially manufactured optical components. A further disadvantage of the known alignment system is that the known self-referencing interferometer is usually quite bulky. This bulkiness may cause unwanted side-effects in the alignment process such as low bandwidth vibration modes that can impede the accuracy of the alignment process.

FIG. 3 shows a schematic overview of a self-referencing interferometer in accordance with an embodiment of the invention. The self-referencing interferometer comprises an optical arrangement OPT and a detector system DET. An alignment beam AB is received by the optical arrangement OPT and focused into an alignment spot onto a mark such as an alignment mark WM on a substrate. The alignment mark WM has a periodic structure. Due to the periodic structure of the alignment mark WM the alignment beam AB is diffracted into a diffracted beam DB. The diffracted beam DB comprises a plurality of diffraction orders, e.g., seven positive and seven negative diffraction orders. It can be noted that the self-referencing interferometer according to an embodiment of the invention can be arranged to be used with an alignment mark or any other type of structure or mark on a product. As an illustration, alignment could be performed on the basis of recognized patterns within the target portion areas, i.e. the dies to be exposed. In FIG. 3 the diffracted beam DB shows two positive diffraction orders, marked +1 and +3, and two negative diffraction orders, marked −1 and −3. In general, each diffraction order of any sign has a corresponding diffraction order of the opposite sign. In the following, when referring to a diffracted beam, reference is meant to relate only to the diffraction orders which are actually used in the self-referencing interferometer, for example only to the +1, +3, −1, and −3 diffraction orders. It is noted that for alignment purposes the −2 and +2 diffraction orders are usually not used, because these diffraction orders often have zero intensity. It will be appreciated that more diffraction orders may actually be produced upon diffraction of the alignment beam AB. It will be understood that another plurality of diffraction orders may be used alternatively, e.g., a single diffraction order of each sign, or a larger plurality of diffraction orders. Using a larger plurality may be advantageous in reducing sensitivity to mark characteristics, such as mark asymmetry.

The optical arrangement OPT captures the diffracted beam DB, for example only consisting of the first and third positive diffraction orders +1 and +3 as well as the corresponding first and third negative diffraction orders −1 and −3. In the further description, a possible zeroth order is ignored: when a zeroth order is present, the optical arrangement OPT will be arranged to spatially filter it out of the diffracted beam DB, or the detector system DET will be arranged to neglect it or to remove its contributions, e.g., by using an aperture stop in the optical path of the zeroth order.

Figure 3A:
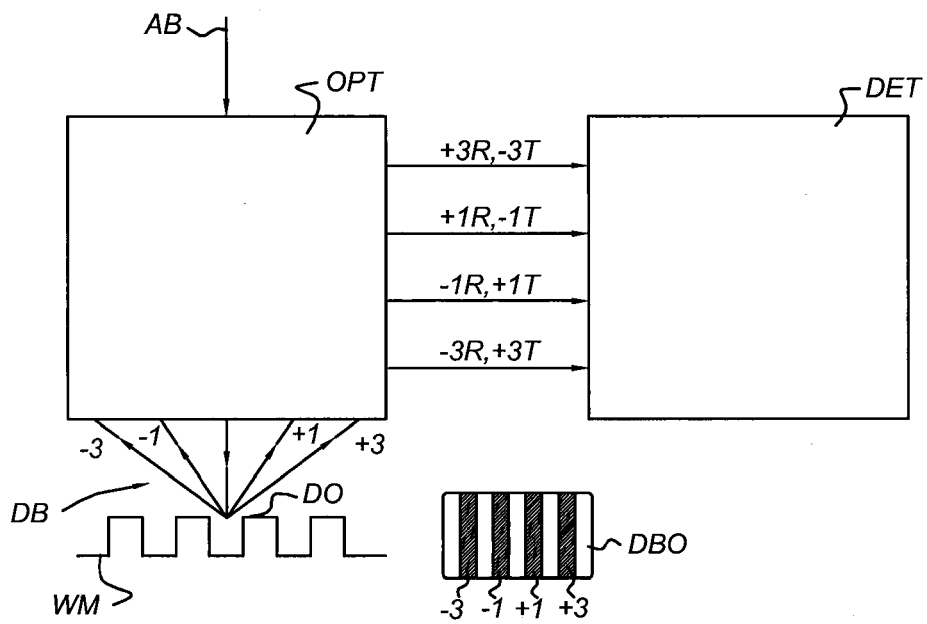
FIG. 3*a* shows a schematic overview of a self-referencing interferometer according to the invention.
Figure 3B:
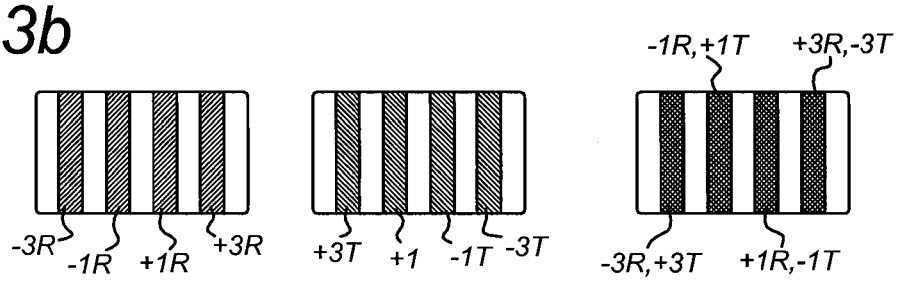
FIG. 3*b* schematically shows the orientation of the reference beam (left), the transformed beam (middle), and the interfering reference beam and transformed beam (right), wherein the transformed beam is flipped relative to the reference beam.
Figure 3C:
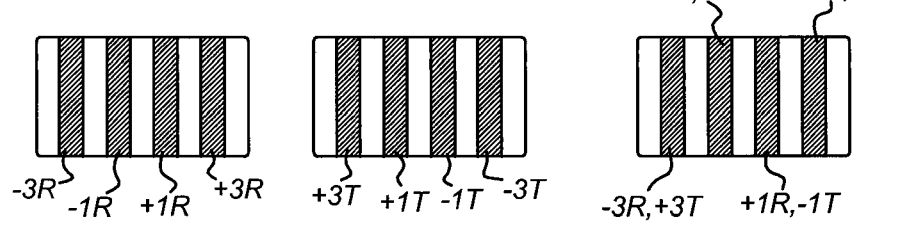
FIG. 3*c* schematically shows the orientation of the reference beam (left), the transformed beam (middle), and the interfering reference beam and transformed beam (right), wherein the transformed beam is rotated 180° relative to the reference beam.

The captured diffracted beam DB has a spatial distribution with an orientation DBO. The orientation DBO may e.g., be defined as an angular orientation in a plane parallel to the substrate W. The orientation of the diffracted beam DBO is schematically indicated in FIG. 3a with a rectangular element with an indication of the diffraction orders −3, −1, +1, +3 in the rectangular element.

In an embodiment, the optical arrangement OPT provides copies of the diffraction orders −3, −1, +1, +3 to the detector system DET. The plurality of copies of the diffraction orders provided to the detector system DET are further referred to as the reference beam, and the contributions of the multiple diffraction orders to this reference beam are denoted with −3R, −1R, +1R and +3R, associated with the respective diffraction orders −3, −1, +1, +3. The contributions of the multiple diffraction orders denoted with −3R, −1R, +1R and +3R may further be referred to as reference diffraction orders. The orientation of the reference beam is the same as the orientation of the captured diffracted beam. The orientation of the reference beam is schematically depicted in the left part of both FIGS. 3b and 3c.

The optical arrangement OPT further provides transformed versions of the diffraction orders −3, −1, +1, +3 to the detector system DET, respectively denoted with −3T, −1T, +1T and +3T. The plurality of transformed diffraction orders are further referred to as the transformed beam. The contributions of the multiple diffraction orders denoted with −3T, −1T, +1T and +3T may further be referred to as transformed diffraction orders. The orientation of the transformed beam differs from the orientation of the reference beam. The transformed beam is either flipped relative to the reference beam (i.e. mirrored with respect to an axis parallel to the lines of the diffraction pattern) or rotated over 180° relative to the reference beam. This is schematically depicted in the middle part of both FIGS. 3b and 3c respectively.

In a self-referencing interferometer in accordance with an embodiment of the invention the output of the optical arrangement OPT to the detector system DET contains both a reference beam and a transformed beam, wherein the reference diffraction orders interfere with their corresponding opposite transformed diffraction orders, i.e. for the −3 diffraction order the −3R reference diffraction order interferes with the +3T transformed diffraction order, for the +1 diffraction order the +1R reference diffraction order interferes with the −1T transformed diffraction order and so on. This is schematically depicted in FIG. 3a between the optical arrangement OPT and the detector system DET and in the right part of both FIGS. 3b and 3c.

In an alternative embodiment, the optical arrangement OPT only uses reference diffraction orders of one sign, i.e. +1R and +3R, to form the reference beam, and corresponding opposite transformed diffraction orders, i.e. −1T and −3T, to form the transformed beam.

The alignment beam AB may be an unpolarized beam, or alternatively a polarized beam. The optical arrangement OPT may comprise polarizing components, such as a polarizing beam splitter and one or more retarding plates, for improving the contrast in the diffraction pattern read by the detector. Also the detector arrangement DET may comprise polarizing components, such as a polarizing beam splitter, one or more retarder plates and/or one or more polarizers acting as analyzers, for separating the different polarization states of the reference beam and the transformed beam.

Figure 4A:
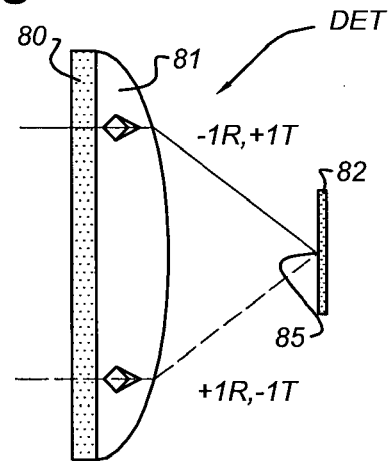
FIG. 4*a*-FIG. 4*d* show exemplary embodiments of detector systems for use in a self-referencing interferometer according to the invention.

The detector system DET may be arranged to detect the reference beam and the transformed beam in an image plane, as e.g., shown in FIG. 4a. FIG. 4a shows an exemplary embodiment of detection in an image plane, by focusing the reference beam (here comprising the reference diffraction orders −1R and +1R) and the transformed beam (here comprising the transformed diffraction orders +1T and −1T) with an exit lens 81 onto a detection spot 85 on a detector 82, causing the reference beam and the transformed beam to interfere at the detector 82, whereby the detector 82 detects an intensity of the detection spot 85. The plurality of reference and transformed diffraction orders may then be focused at substantially a single detection spot 85 on the detector 82. As the alignment beam AB is moved along the alignment mark WM on a substrate, the intensity of the detection spot 85 will vary. The detector 82 may then determine a position signal from the variation of the intensity, e.g., indicating where the intensity shows an optimum. As shown in FIG. 4*a*, the exit lens 81 may be provided with a polarizer 80, to manipulate the polarization of the reference beam and the transformed beam such that they can interfere with each other, e.g., by having equal polarization, on the detector 82.

Figure 4B:
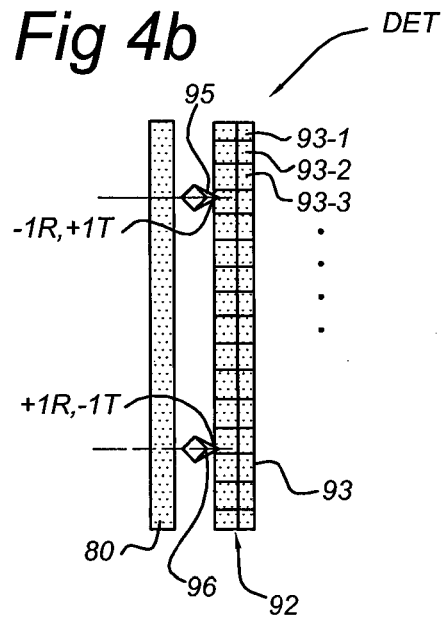

The detector system DET may alternatively be arranged to detect the reference beam and the transformed beam in a pupil plane, as e.g., shown in FIG. 4*b*. FIG. 4*b* shows an exemplary embodiment of detection in a pupil plane, where a detector array 92 is positioned. The detector array 92 comprises a plurality of detector elements 93 which are individually denoted in FIG. 4*b* by 93-1, 93-2, 93-3 and so on. The reference beam (here comprising the reference diffraction orders −1R and +1R) and the transformed beam (here comprising the transformed diffraction orders +1T and −1T) are incident on the detector array 92, where the reference diffraction orders and the corresponding opposite transformed diffraction orders interfere. E.g., reference diffraction order −1R and transformed diffraction order +1T are incident and interfere on a first position 95 on the detector array 92, whereas reference diffraction order +1R and transformed diffraction order −1T are incident and interfere on a second position 96 on the detector array 92. It will be appreciated that when additional diffraction orders, e.g., the third order diffraction orders, are provided by the optical arrangement OPT, these additional diffraction orders will be incident at other, specific positions on the detector array 92. The detector array 92 is thus capable of spatially separated detection of the respective intensities of the interfering reference and transformed diffraction orders. As the alignment beam AB is moved along the alignment mark WM on a substrate, the respective intensities will vary. The detector array 92 may then determine a position signal from the variation of the intensities, wherein analysis of the relative and/or absolute intensities may be used to provide a refined position signal, e.g., corrected for mark asymmetry and/or mark depth.

Figure 4C:
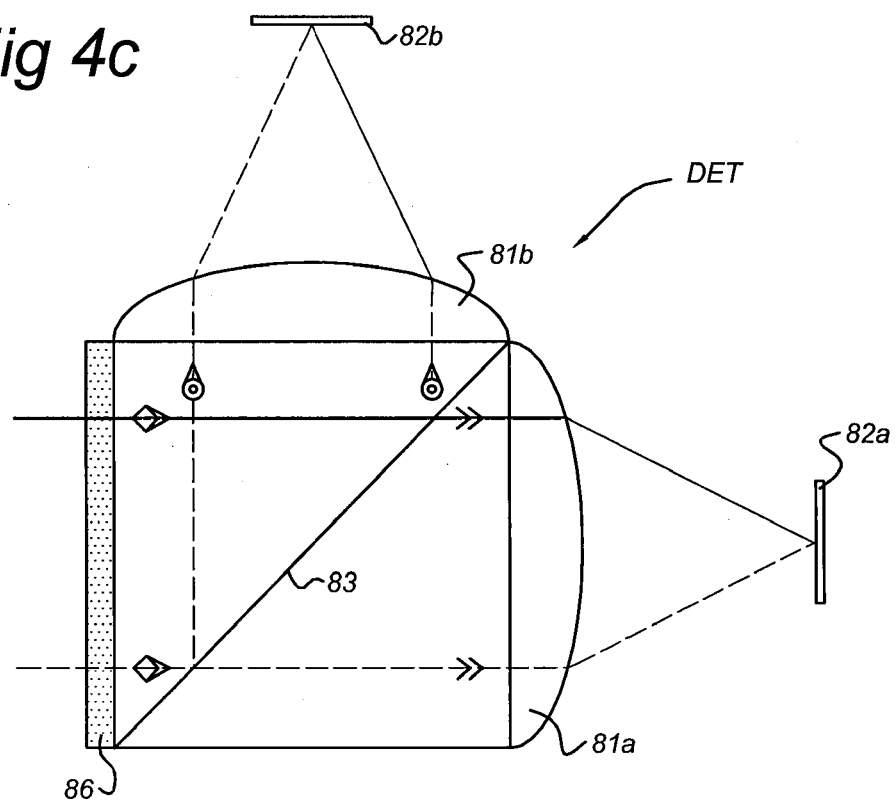

FIG. 4*c* shows an alternative embodiment of detection in an image plane. The embodiment differs from the embodiment in FIG. 4*a*, in that the interfering reference beam and transformed beam are separated in two parts, a first part corresponding to a polarization state in the plane of the drawing and a second part corresponding to a polarization state perpendicular the plane of the drawing. This separation is obtained using a retarder plate 86 instead of a polarizer 80 in FIG. 4*a*, and a polarizing beam splitter with a polarizing beam splitting surface 83. The first part is focused using a first detector lens 81*a* on a first detector 82*a*, where the reference beam and the transformed beam in a polarization in the plane of the drawing are focused in a spot and interfere. The second part is focused using a second detector lens 81*b* on a second detector 82*b*, where the reference beam and the transformed beam in a polarization perpendicular the plane of the drawing are focused in a spot and interfere. Compared to the detector arrangement of FIG. 4*a* with a polarizer 80, this alternative embodiment has the benefit that all light is being used, whereas the embodiment of FIG. 4*a* uses only half of the light due to the effect of the polarizer 80.

Figure 4D:
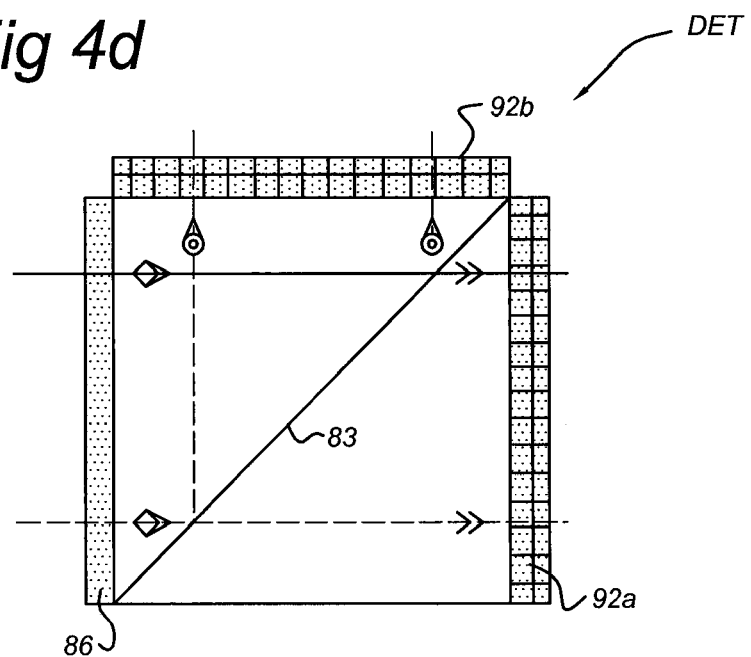

FIG. 4*d* shows an alternative embodiment of detection in a pupil plane. The embodiment differs from the embodiment in FIG. 4*b*, in that the interfering reference beam and transformed beam are separated in two parts, a first part corresponding to a polarization state in the plane of the drawing and a second part corresponding to a polarization state perpendicular the plane of the drawing, using a retarder plate 86 and a polarizing beam splitter with a polarizing beam splitting surface 83 similar as in FIG. 4*c*. The first part is incident on a first detector array 92*a*, where the reference beam and the transformed beam in a polarization in the plane of the drawing interfere, with the different diffraction orders spatially separated on the first detector array 92*a*. The second part is incident on a second detector array 92*b*, where the reference beam and the transformed beam in a polarization perpendicular to the plane of the drawing interfere, with the different diffraction orders spatially separated on the second detector array 92*b*.

Figure 5:
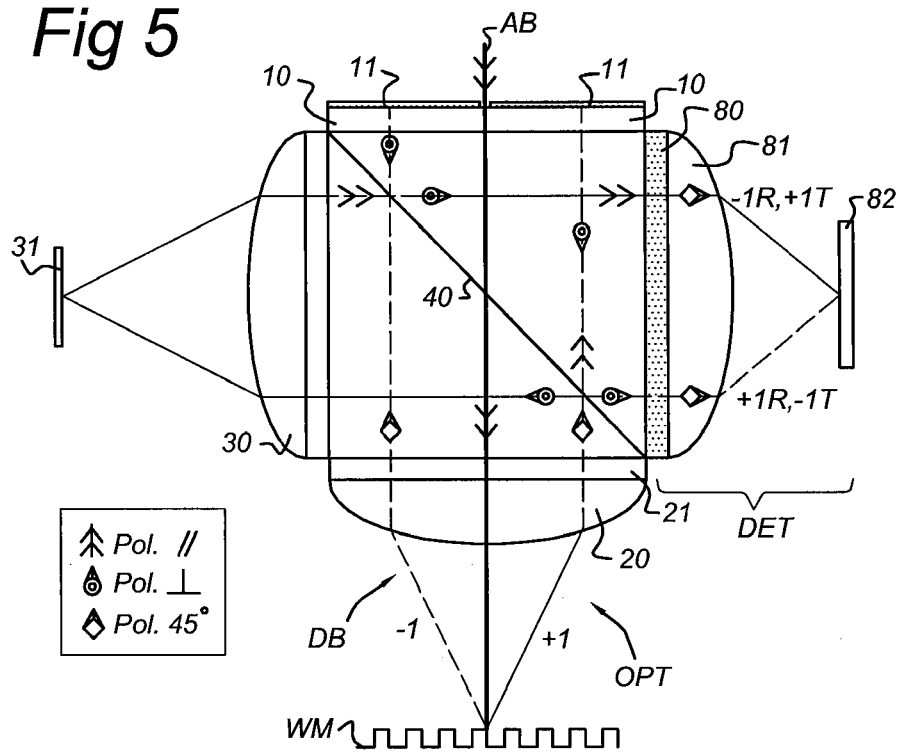
FIG. 5 shows a first exemplary embodiment of a self-referencing interferometer of a first type according to the invention.

FIG. 5 shows a first exemplary embodiment of a self-referencing interferometer of a first type comprising an optical arrangement OPT and a detector system DET.

The optical arrangement OPT is arranged to receive an alignment beam AB, of which the light is polarized parallel to the plane of the drawing. The alignment beam AB is subsequently substantially fully transmitted by a beam splitting surface 40 of a polarizing beam splitter 40 and a retarder 21, which makes the light elliptically polarized. Subsequently, an objective lens 20 directs the alignment beam AB to the alignment mark WM, where it is diffracted into a diffracted beam DB, having a first positive diffraction order, denoted with +1, and a corresponding first negative diffraction order, denoted with −1. The first positive diffraction order +1 and the first negative diffraction order −1 are captured by the objective lens 20, and pass the retarder 21, after which the light is 45°-polarized. The beam splitting surface 40 splits the light into a transmitted ray and a reflected ray.

FIG. 5 shows the optical path of the first positive diffraction order +1. The transmitted ray is in-plane polarized and proceeds to a further retarder plate 10, causing a transformation of the polarization rotation at each pass, on first mirror 11, where it is reflected back by the first mirror 11 to the beam splitter surface 40 with its polarization rotated by 90°, i.e. perpendicular to the plane of the drawing. The beam splitter 40 then reflects it towards the detection system DET, where an exit lens 81 focuses it onto a detector 82, where it contributes to the formation of the reference wavefront, as was described with reference to FIG. 4*a*. The reflected ray is focused onto a second mirror 31 using a transforming lens 30. The second mirror 31 and the transforming lens 30 cooperate to swap the positions of the positive and negative diffraction orders. In addition, the polarization is rotated by 90° so that the light is fully transmitted through the beam splitter surface 40 on its way to the detector system DET. It is then focused with the exit lens 81 onto the detector 82, where it contributes to the formation of the transformed wavefront.

The other diffraction orders captured by the objective lens 20, e.g., diffraction order −1, experience a similar behavior as described for the +1 order. They are therefore also split into two kinds of rays, those contributing to the reference wavefront and those contributing to the transformed wavefront.

In order to have a self-referencing interferometer, a polarizer 80 is used in the detector system DET, so that the positive and corresponding negative order leaving the optical arrangement OPT at the same position (i.e., the positive reference order and the corresponding negative transformed order) interfere to modulate the intensity at the detector of the detector system.

In general, the best results are obtained if the reference beam and the transformed have the same intensity and if the intensity is as high as possible. Therefore it is preferable to avoid loss of light in the self-referencing interferometer. If the reference beam and the transformed beam don't have the same intensity this might result in a loss of contrast.

The retarders can be simple λ/4 plates, with their fast axis oriented at 45° and 22.5° for retarder 21 and retarder 10 respectively with respect to the direction of polarization of the incoming light (i.e., the light coming from inside the beam splitter).

As an alternative, retarder 21 can be replaced by e.g., a λ/8 plate oriented at 45°, which will cause the beam to be circularly polarized after the two passes through it. The beam is then split into two orthogonally polarized beams by the polarizing beam splitter.

In a variant to this embodiment, the polarizing beam splitter is replaced by a neutral beam splitter and the retarders are absent. This may decrease the cost of the optical arrangement, but may be associated with a reduced contrast at the detector arrangement.

It will be appreciated that the detector arrangement DET may alternatively be arranged to detect in a pupil plane, as shown in e.g., FIG. 4b. It will be appreciated that the detector arrangement DET may alternatively be provided as e.g., shown in FIG. 4c (e.g., detection in an image plane) and FIG. 4d (e.g., detection in a pupil plane).

The first exemplary embodiment may use a spherical lens as the transforming lens 30. The effect of focusing the diffracted beam onto the second mirror 31 positioned in the focal plane of the spherical lens is that the resulting transformed beam is rotated by 180° degrees relative to the reference beam.

The first exemplary embodiment may alternatively use a cylindrical lens as the transforming lens 30, with the long axis of the cylindrical lens being oriented parallel to the beam splitting surface 40. The effect of focusing the diffracted beam onto the second mirror 31 positioned in the focal plane of the cylindrical lens is that the resulting transformed beam is flipped, i.e., mirrored in the plane perpendicular to the second mirror 31, relative to the reference beam.

Figure 6:
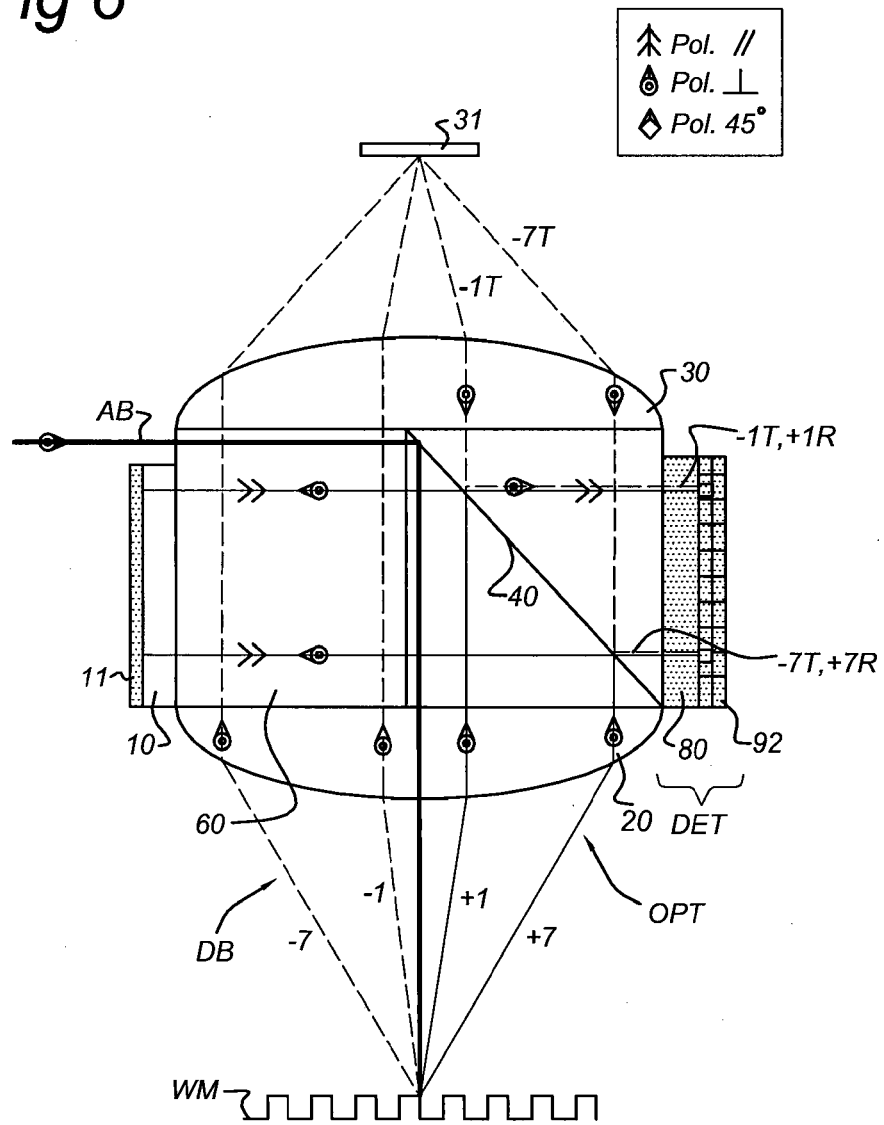
FIG. 6 shows a second exemplary embodiment of a self-referencing interferometer of the first type according to the invention.

FIG. 6 shows a second exemplary embodiment of a self-referencing interferometer of the first type comprising an alternative optical arrangement OPT and a detector system DET.

The detector system DET is shown according to the embodiment shown in FIG. 4b, but may alternatively be provided according to other suitable embodiments, e.g., as shown in FIG. 4a, FIG. 4c or FIG. 4d.

The optical arrangement OPT is arranged to receive an alignment beam AB, of which the light is polarized perpendicular to the plane of the drawing. The alignment beam AB is subsequently substantially fully reflected by a beam splitting surface 40 of a polarizing beam splitter and directed via an objective lens 20 to the alignment mark WM, where it is diffracted into a diffracted beam DB, having a plurality of positive diffraction orders, of which a first positive diffraction order +1 and a seventh positive diffraction order +7 are shown, and a corresponding plurality of negative diffraction orders, of which a first negative diffraction order −1 and a seventh negative diffraction order −7 are shown. The positive diffraction orders +1, . . . , +7 and the negative diffraction orders −1, . . . , −7 are captured by the objective lens 20.

The positive diffraction orders +1, . . . , +7 are then reflected by the beam splitting surface 40, and directed to a retarder plate 10, which causes a transformation of the polarization rotation at each pass, and a first mirror 11, where the positive diffraction orders are reflected back by the first mirror 11, again pass the retarder plate 10, to travel to the beam splitter surface 40 with its polarization in the plane of the drawing. The beam splitter 40 then transmits the positive diffraction orders towards the detection system DET, and provides the positive diffraction orders as the reference beam, of which the first reference order +1R and seventh reference order +7R are shown.

Also the negative diffraction orders −1, . . . , −7 are captured by the objective lens 20. The negative diffraction orders −1, . . . , −7 may subsequently pass through an optical path length compensator 60, and are then focused onto a second mirror 31 using a transforming lens 30. The second mirror 31 is positioned in the focal plane of the transforming lens 30. The second mirror 31 and the transforming lens 30 cooperate to change the orientation of the negative diffraction orders −1, . . . , −7. After the negative diffraction orders −1, . . . , −7 have been reflected by the mirror 31 and captured again by the transforming lens 30, they travel to the beam splitter surface 40 with its polarization perpendicular to the plane of the drawing, so that they are reflected by the beam splitter surface 40 towards the detection system DET, whereby the transformed negative diffraction orders are provided as the transformed beam, interfering with the corresponding reference diffraction orders of opposite sign. The transformed first order −1T interfering with the first reference order +1R, and the transformed seventh order −7T, interfering with the seventh reference order +7R, are shown. These interferences may be detected as intensities in a similar way as described before.

The second exemplary embodiment as shown in FIG. 6 may potentially be manufactured in a smaller size than the first exemplary embodiment as shown in FIG. 5. It is noted that the second exemplary embodiment uses a reference beam associated with diffraction orders of a single sign (here referred to as the positive diffraction orders) and a transformed beam associated with diffraction orders of the opposite sign (here referred to as the negative diffraction orders), whereas the first exemplary embodiment uses a reference beam associated with diffraction orders of a both signs and, hence also, a transformed beam associated with diffraction orders both signs.

The second exemplary embodiment may use a spherical lens as the transforming lens 30. The effect of focusing the diffracted beam onto the second mirror 31 positioned in the focal plane of the spherical lens, together with the subsequent reflection by the beam splitting surface 40, is that the resulting transformed beam is rotated by 180° degrees relative to the reference beam.

The second exemplary embodiment may alternatively use a cylindrical lens as the transforming lens 30, with the long axis of the cylindrical lens being oriented parallel to the beam splitting surface 40. The effect of focusing the diffracted beam onto the second mirror 31 positioned in the focal plane of the cylindrical lens, together with the subsequent reflection by the beam splitting surface 40, is that the resulting transformed beam is flipped, i.e., mirrored in a plane perpendicular to the drawing and perpendicular to the first mirror 11, relative to the reference beam.

Figure 7:
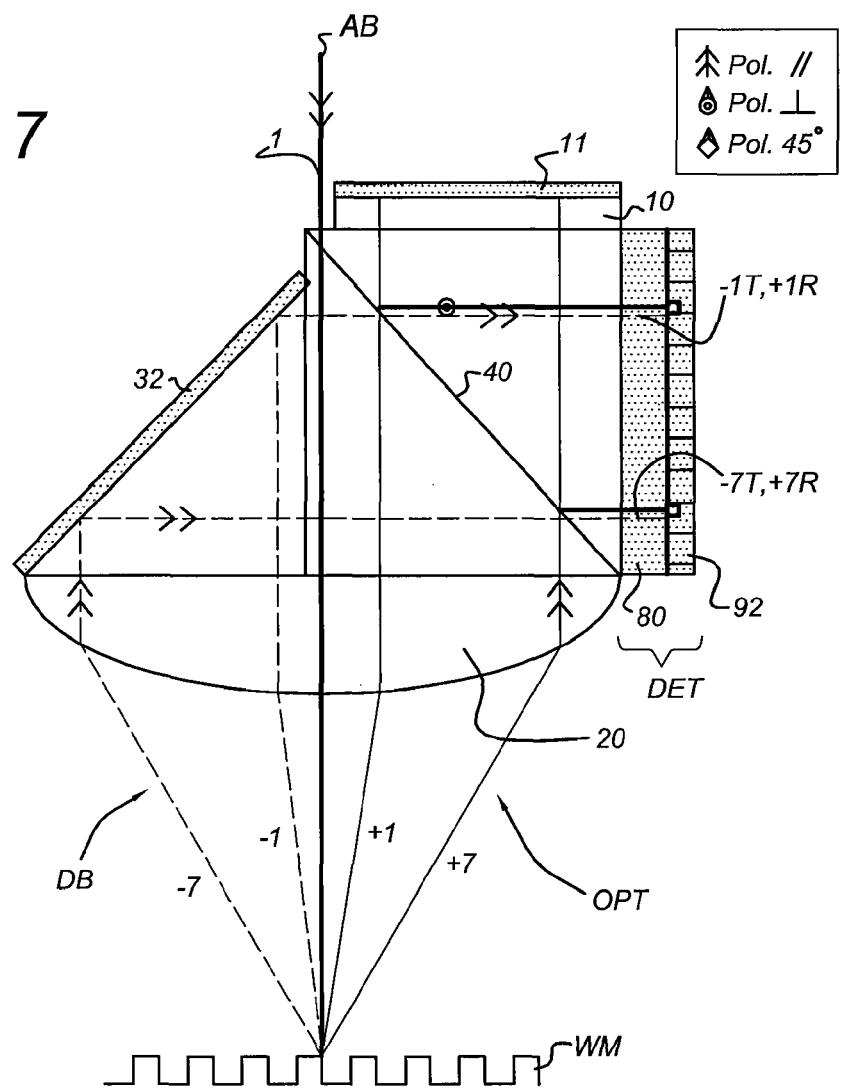
FIG. 7 shows a first exemplary embodiment of a self-referencing interferometer of a second type according to the invention.

FIG. 7 shows a first exemplary embodiment of a self-referencing interferometer of a second type comprising an alternative optical arrangement OPT and a detector system DET. The second type differs from the first type in that, at least, the transformed beam is created without using a transforming lens 30.

The detector system DET is shown according to the embodiment shown in FIG. 4b, but may alternatively be provided according to other suitable embodiments, e.g., as shown in FIG. 4a, FIG. 4c or FIG. 4d.

The optical arrangement OPT is arranged to receive an alignment beam AB, of which the light is polarized in the plane of the drawing. The alignment beam AB is subsequently substantially directed with an objective lens 20 to the alignment mark WM, where it is diffracted into a diffracted beam DB, having a plurality of positive diffraction orders, of which a first positive diffraction order +1 and a seventh positive diffraction order +7 are shown, and a corresponding plurality of negative diffraction orders, of which a first negative diffraction order −1 and a seventh negative diffraction order −7 are shown. The positive diffraction orders +1, . . . , +7 and the negative diffraction orders −1, . . . , −7 are captured by the objective lens 20.

The positive diffraction orders +1, . . . , +7 are then transmitted by the beam splitting surface 40, and directed to a retarder plate 10, which causes a transformation of the polarization rotation at each pass, and a first mirror 11, where the positive diffraction orders are reflected back by the first mirror 11, again pass the retarder plate 10, to travel to the beam splitter surface 40 with its polarization perpendicular to the plane of the drawing. The beam splitter 40 then reflects the positive diffraction orders towards the detection system DET, and provides the positive diffraction orders as the reference beam, of which the first reference order +1R and seventh reference order +7R are shown.

Also the negative diffraction orders −1, . . . , −7 are captured by the objective lens 20. The negative diffraction orders −1, . . . , −7 are subsequently reflected by a transforming mirror 32, which is a flat mirror oriented at a 45° angle relative to direction of the negative diffraction orders −1, . . . , −7. After the negative diffraction orders −1, . . . , −7 have been reflected by the transforming mirror 32 as transformed negative diffraction orders −1T, . . . , −7T, they travel to the beam splitter surface 40 with its polarization in the plane of the drawing, so that they are transmitted by the beam splitter surface 40 towards the detection system DET, whereby the transformed negative diffraction orders are provided as the transformed beam, interfering with the corresponding reference diffraction orders of opposite sign. The transformed first order −1T interfering with the first reference order +1R and the transformed seventh order −7T interfering with the seventh reference order +7R are shown in FIG. 7. These interferences may be detected as intensities in a similar way as described before.

The effect of mirroring the diffracted beam onto the transforming mirror 32 oriented at a 45° angle to the diffracted beam, is that the resulting transformed beam is flipped, i.e., mirrored in a plane perpendicular to the drawing and parallel to the first mirror 11, relative to the reference beam.

Figure 8:
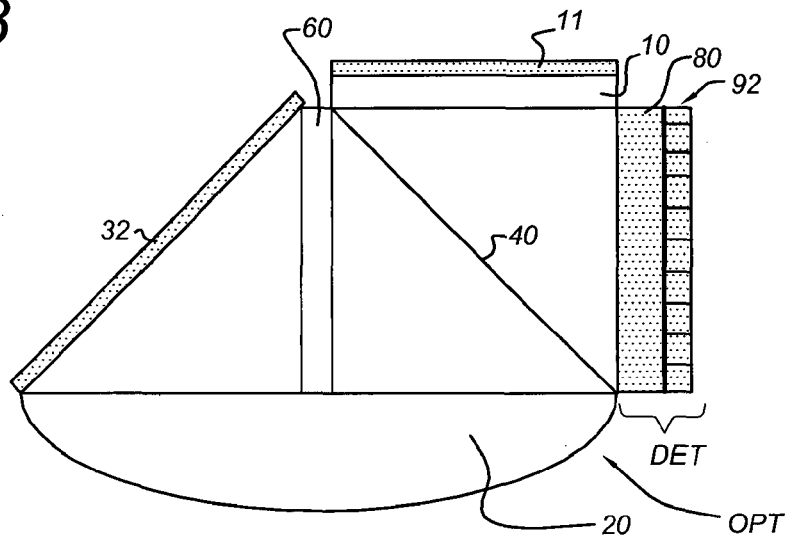
FIG. 8 shows a second exemplary embodiment of a self-referencing interferometer of the second type according to the invention.

FIG. 8 shows a second exemplary embodiment of a self-referencing interferometer of the second type. The second exemplary embodiment of FIG. 8 differs from the first exemplary embodiment of FIG. 7, in that an optical path length compensator 60 is present. The optical path length compensator 60 is positioned in the optical path of the transformed beam, i.e., in between the transforming mirror 32 and the beam splitting surface 40. The optical path length compensator 60 is provided with an optical thickness so as to provide an equal optical path length for the transformed beam (via the transforming mirror, the optical path length compensator, and the beam splitter) and the reference beam (via the retarder plate 10 and the beam splitter). The optical arrangement OPT may thus be used with an alignment beam AB with a relatively short coherence length.

Figure 9:
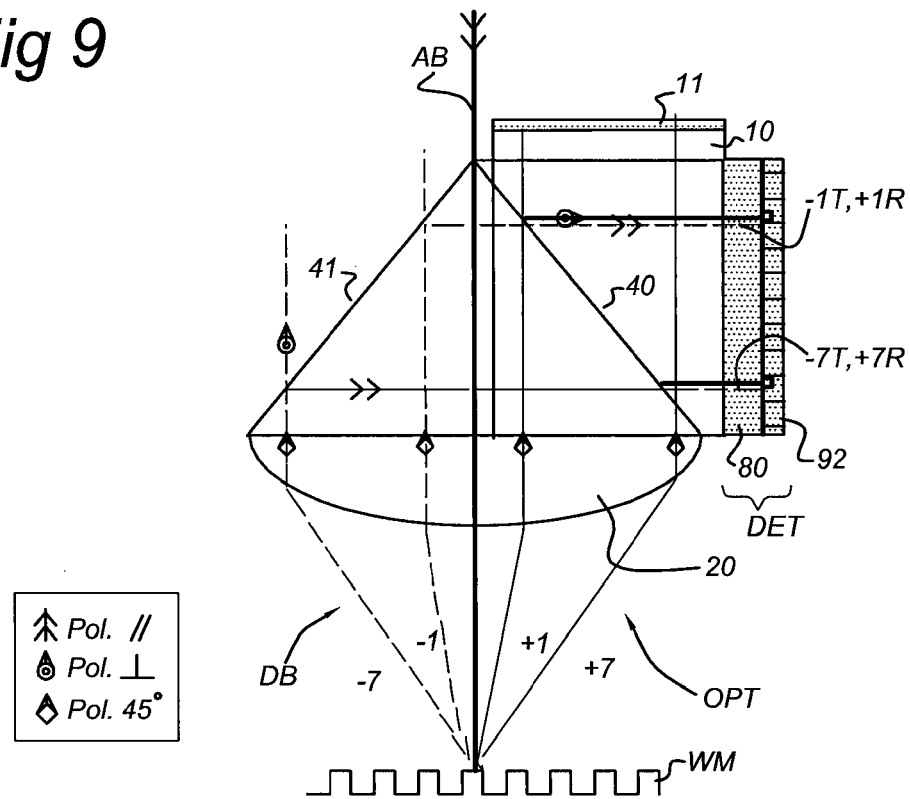
FIG. 9 shows a third exemplary embodiment of a self-referencing interferometer of the second type according to the invention.

FIG. 9 shows a third exemplary embodiment of a self-referencing interferometer of the second type comprising an alternative optical arrangement OPT and a detector system DET.

The third exemplary embodiment shown in FIG. 9 differs from the first exemplary embodiment of FIG. 7, in that the transforming mirror 32 is replaced by a second beam splitter with a second beam splitter surface 41. As a result, again transformed negative diffraction orders are provided from a reflection at a surface under a 45° angle, now the second beam splitter surface 41 (taking the place of the transforming mirror 32 in FIG. 8). The skilled person will understand the details of the third exemplary embodiment from the explanation of the first exemplary embodiment, so that no further explanation will be given here.

Figure 10:
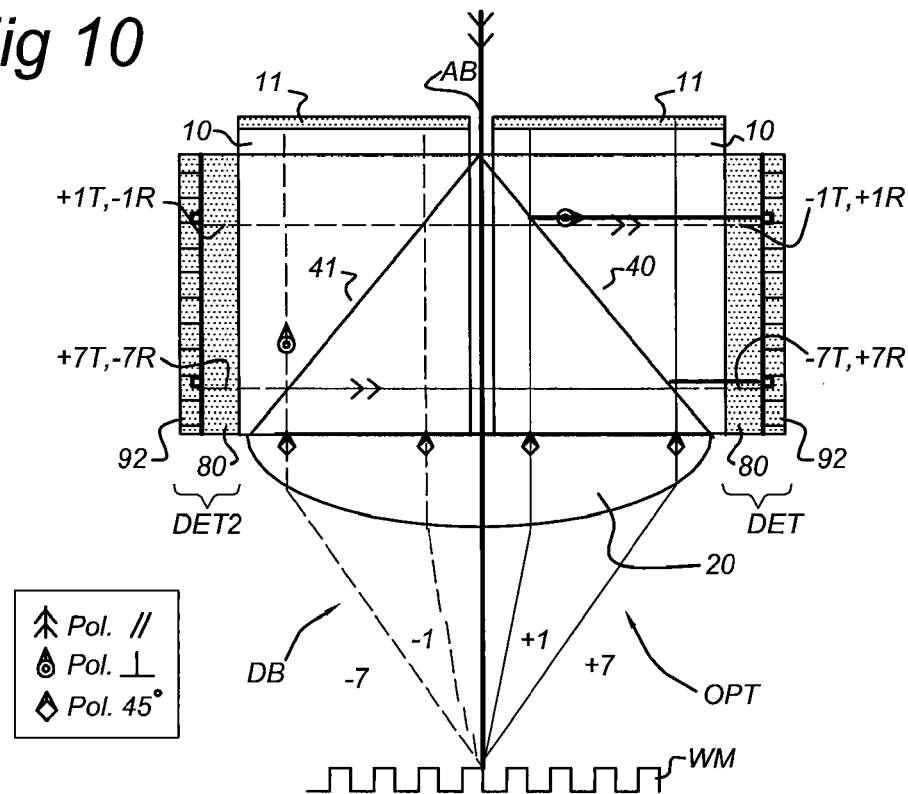
FIG. 10 shows a fourth exemplary embodiment of a self-referencing interferometer of the second type according to the invention.

FIG. 10 shows a fourth exemplary embodiment of a self-referencing interferometer of the second type comprising an alternative optical arrangement OPT and a detector system DET. The fourth exemplary embodiment shown in FIG. 10 differs from the third exemplary embodiment shown in FIG. 9, in that the second beam splitter 41 is also provided with a retarder 10 and a first mirror 11, as well as that the detector arrangement DET is further provided with a second detector arrangement DET2. Now, the second beam splitter surface 41 acts as a transforming mirror for the negative diffraction orders and the beam splitter surface 40 ensures that the transformed negative diffraction orders interfere with the reference positive diffraction orders, as described above with reference to FIG. 7-FIG. 9, thus e.g., −1T and +1R interfere at the detector array 92 of detector DET. Also, the beam splitter surface 40 acts as a transforming mirror for the positive diffraction orders and the second beam splitter surface 41 ensures that the transformed positive diffraction orders interfere with the reference negative diffraction orders, which are created using the retarder 10 and first mirror 11 provided on the second beam splitter 41 (i.e., in the left part of FIG. 10), thus e.g., +1T and −1R interfere at the detector array 92 of detector DET2. In this manner, a self-referencing interferometer of the second type is provided wherein diffraction orders of both signs are used to create the reference beam as well as the transformed beam.

According to further improvements, the self-referencing interferometer is further arranged to provide a focusing signal indicative for the focus quality of the alignment beam AB on the alignment mark WM, or on another, e.g., non-structured—in particular flat—part of the substrate or substrate table that carries the alignment mark WM. The self-referencing interferometer may thus be used for alignment as well as for focusing.

Figure 11:
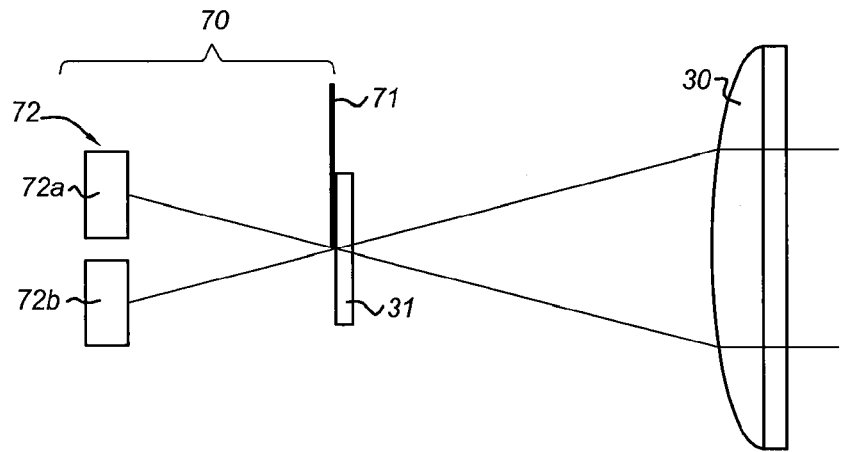
FIG. 11 and FIG. 12 show focus detection arrangements for use in a self-referencing interferometer according to the invention.

FIG. 11 shows a further improvement in accordance with an embodiment of the invention, usable in embodiments of a self-referencing interferometer of the first type. In FIG. 11, the second mirror 31 (used to create the transformed beam in cooperation with the transforming lens 30), is a semi-transparent mirror. The semi-transparent mirror may have a high reflectivity and a low transparency, e.g., a transparency below 10%, such as 5%. The second mirror 31 thus largely reflects the focused diffracted beam to create the transformed beam, which may thus be used effectively the same as described with reference to FIG. 5 and FIG. 6. The second mirror 31 however also transmits a small fraction of the diffracted beam, e.g., 5% of the light of the diffracted beam.

A focus detection arrangement 70 is provided behind the semi-transparent mirror 31. The focus detection arrangement 70 is based on the so-called Foucault knife edge technique. The focus detection arrangement 70 comprises a knife edge 71, positioned with one end at the center of the focus on the semi-transparent mirror 31. The focus detection arrangement 70 further comprises a two-segment detector 72, having a first detector segment 72a, arranged to provide a first focus signal proportional to the light intensity on the first detector segment 72a, and a second detector segment 72b, arranged to provide a second focus signal proportional to the light intensity on the second detector segment 72b. The knife edge 71 and the two-segment detector 72 are arranged such that both detector segments 72a and 72b receive the same light intensity when the alignment beam AB is well focused on the alignment mark WM (or on another, e.g., non-structured—in particular flat—part of the substrate that carries the alignment mark WM), associated with the diffracted beam being well focused on the semi-transparent mirror 31. However, when the alignment beam AB is focused above or below the alignment mark WM, the light intensities will be different. The two-segment detector 72 may thus be arranged to provide a difference signal, composed by a difference between the first focus signal and the second focus signal, allowing to measure and/or control the focusing of the alignment beam AB on the alignment mark WM (or on the other, e.g., non-structured—in particular flat—part of the substrate that carries the alignment mark WM).

Figure 12:
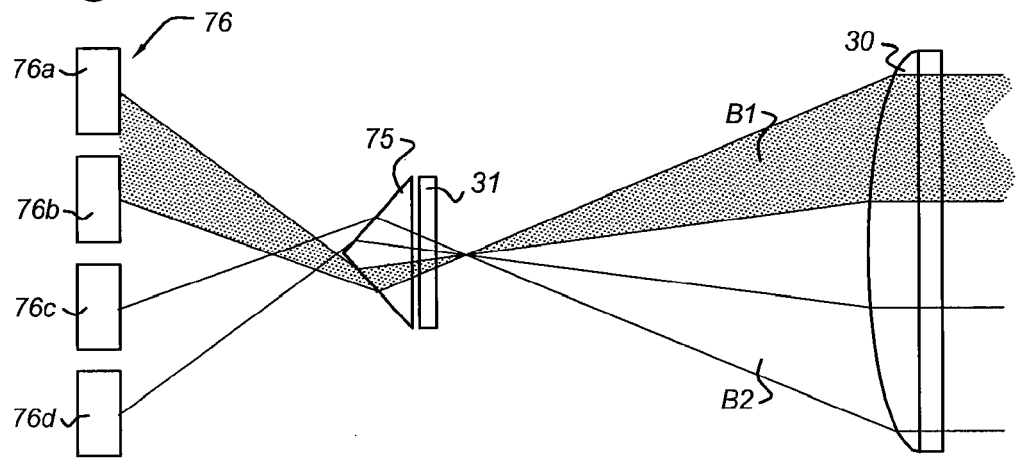

FIG. 12 shows an alternative to the further improvement shown in FIG. 11. The arrangement of FIG. 12 may have a lower positional sensitivity, laterally and/or longitudinally) than the arrangement of FIG. 11, and may thus provide an improved robustness to the focusing system. In FIG. 12, the second mirror 31 (used to create the transformed beam in cooperation with the transforming lens 30), is a semi-transparent mirror, similar as in FIG. 11. The semi-transparent mirror may have a high reflectivity and a low transparency, e.g., a transparency below 10%, such as 5%. The second mirror 31 thus largely reflects the focused diffracted beam to create the transformed beam, which may thus be used effectively the same as described with reference to FIG. 5 and FIG. 6. The second mirror 31 however also transmits a small fraction of the diffracted beam, e.g., 5% of the light of the diffracted beam.

A focus detection arrangement 70 is provided behind the semi-transparent mirror 31. The focus detection arrangement 70 comprises a roof-top prism 75, centered relative to the position of the focused diffracted beam on the semi-transparent mirror 31. The focus detection arrangement 70 further comprises a four-segment detector 76, having a first detector segment 76a, arranged to provide a first focus signal proportional to the light intensity on the first detector segment 76a, a second detector segment 76b, arranged to provide a second focus signal proportional to the light intensity on the second detector segment 76b, a third detector segment 76c, arranged to provide a third focus signal proportional to the light intensity on the third detector segment 76c, and a fourth detector segment 76d, arranged to provide a fourth focus signal proportional to the light intensity on the fourth detector segment 76d. The roof-top prism 75 and the four-segment detector 76 are arranged such that the two detector segments 76a and 76b, as well as the two other detector segments 76c and 76d, receive the same light intensity when the alignment beam AB is well focused on the alignment mark WM (or on another, e.g., non-structured—in particular flat—part of the substrate that carries the alignment mark WM). Also the light distribution is symmetrical between the upper two detector segments 76a and 76b compared to the lower two detector segments 76c and 76d. However, when the alignment beam AB is focused above or below the alignment mark WM, the light intensities will be different and the light distribution will be asymmetrical. The four-segment detector 76 may thus be arranged to provide a difference signal which is indicative for the focus quality, and which allows to measure and/or control the focusing of the alignment beam AB on the alignment mark WM (or on the other, e.g., non-structured—in particular flat—part of the substrate that carries the alignment mark WM).

Figure 13A:
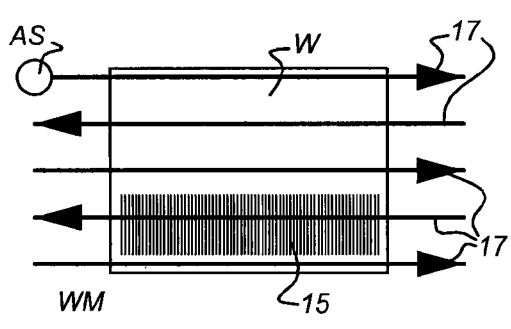
FIG. 13*a* and FIG. 13*b* show embodiments of alignment spots suitable for use in embodiments of the invention.
Figure 13B:
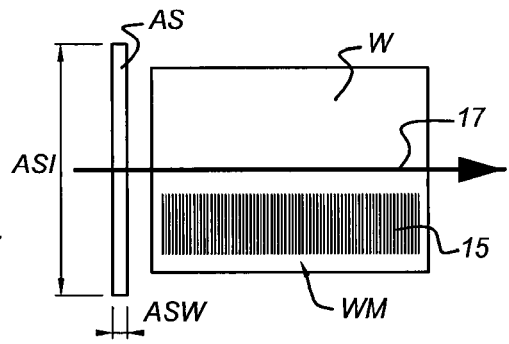

FIG. 13a and FIG. 13b show two embodiments of an alignment spot AS suitable for use in embodiments of the invention. FIG. 13a shows a substantially circular alignment spot AS. Such substantially circular alignment spot AS may e.g., be provided from focusing an alignment beam with a substantially circular cross-section using a spherical objective lens 20. Such a substantially circular alignment spot AS may be advantageous e.g., as it may be associated with a relatively large tolerance against the relative orientation of the alignment mark WM with bar-shaped structures 15. However, a relatively large number of scans 17 over the substrate W may be required to find locations of the alignment mark(s) WM.

FIG. 13b shows an elongated, e.g., a substantially line-shaped, alignment spot AS. Such an elongated alignment spot AS may e.g., be provided from focusing an alignment beam with a substantially circular cross-section using a cylindrical objective lens 20. Such an elongated alignment spot AS may be advantageous e.g., as it provides the alignment measurement system with a large capture range, meaning that, due to its extended nature, it allows to easily detect the presence and position of an alignment mark WM with a relatively low density of scans 17 over the surface of a substrate carrying the alignment mark WM, whereas a small circular alignment spot may require a relatively high density of scans over the surface of the substrate. Use of an elongated spot AS may however be associated with a relatively small tolerance against the relative orientation of the alignment mark WM.

As described before, after having traversed the mask MA, the radiation beam B passes through the projection system PS, which focuses the beam onto the target portion C of the substrate W. The substrate W needs to be well-aligned and the radiation beam B needs to be well-focused while the projection system is projecting the patterned beam onto the target portion of the substrate, thus while the pattern is transferred from the patterning device to the target portion. Known systems typically use a two-stage procedure. During a first stage, the substrate W is scanned with one alignment beam AB for determining the relative position of a plurality of locations on the substrate W using one self-referencing interferometer, which typically is a relatively large and expensive interferometer. An accurate positioning can then be done during a subsequent second stage, wherein the pattern is actually transferred to the target portion C, using the relative positions determined during the first stage. An aspect of an embodiment of the invention provides a lithographic apparatus with an alignment system comprising a plurality of self-referencing interferometers according to embodiments of the invention, wherein the alignment system is arranged to perform the aligning while the projection system PS is projecting the patterned beam onto the target portion C of the substrate W.

FIG. 14a and FIG. 14b illustrate embodiments of this aspect. FIG. 14a shows a top view of a substrate W during a scan of a patterned beam B over the substrate. The patterned beam is surrounded by eight substantially circular alignment spots AS, indicated with AS1, . . . , AS8, provided by eight corresponding alignment beams AB from eight self-referencing interferometers respectively. It will be appreciated that it is not necessary to surround the patterned beam by exactly eight alignment spots AS, other numbers of alignment spots AS might be applicable as well. The self-referencing interferometers are provided closely to the position where the projection system PS faces the substrate W. Their relatively compact size may allow to place the self-referencing interferometers at such positions. Their relatively low cost may allow to use multiple self-referencing interferometers. The alignment system may determine alignment signals during operation of the projection system using the eight self-referencing interferometers, and optionally also focusing signals when the eight self-referencing interferometers are equipped with a focus detection arrangement 70 as described before. This may allow a real-time alignment, and optionally focusing, which may advantageously decrease the total throughput time for processing a substrate. Moreover, this may make the need for lithographic apparatuses equipped with multiple substrate stages redundant. Other advantages may be improved overlay results and the use of more compact and less complex alignment sensors. With the present invention it is not necessary to use alignment sensors comprising relative expensive optical components which need to be specially manufactured and customized (e.g., with specific strict requirements relating to shape and purity). In stead alignment sensors can be used comprising relatively cheap and well known standard optical components.

Moreover, when a plurality of alignment marks is provided along lines 18 on the substrate W, e.g., along scribe lines, the alignment marks may be used to guide the alignment spots AS1, . . . , AS8, and hence the projection beam, along the substrate W.

FIG. 14*b* illustrates an alternative embodiment, wherein the patterned beam B is surrounded by four line-shaped alignment spots AS, indicated with AS1, . . . , AS4, provided by four corresponding alignment beams AB from four self-referencing interferometers respectively. Two of the line-shaped alignment spots AS1 and AS3 are oriented perpendicular to the other two line-shaped alignment spots AS2 and AS4, allowing to use any direction for scanning the substrate, in particular to scan the substrate in a zig-zag direction with scan strokes perpendicular to each other between subsequent scan strokes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The terms "broadband light" and "broadband illumination" used herein encompass light with multiple ranges of wavelengths, including wavelengths within the visible spectrum as well as in the infrared regions. Furthermore, it should be understood that the multiple ranges of wavelengths not necessarily join together.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. In addition, it should be appreciated that structural features or method steps shown or described in any one embodiment herein can be used in other embodiments as well. In the claims, any reference signs placed between parentheses shall not be construed as limiting the claim. Throughout this document, the term "and/or" includes any and all combinations of one or more of the associated listed items.

The invention claimed is:

1. A self-referencing interferometer arranged to be used with a mark and a lithographic apparatus, the self-referencing interferometer comprising:

an optical arrangement for creating a reference beam and a transformed beam from an alignment beam, for outputting to a detector said reference beam and said transformed beam, for directing the alignment beam onto the mark and for capturing a diffracted beam resulting from diffraction of the alignment beam by the mark, wherein the diffracted beam comprises at least one positive diffraction order and at least one corresponding negative diffraction order; the optical arrangement comprising:

a beam splitter configured and arranged to split the diffracted beam into a first beam and a second beam, and for combining and outputting to said detector said reference beam and said transformed beam so that the diffraction orders in said reference beam spatially overlap with their corresponding opposite diffraction orders in said transformed beam;

a referencing system constructed and arranged to create said reference beam from the first beam and to direct said reference beam to the beam splitter;

a transforming system for transforming the second beam into said transformed beam and for directing said transformed beam to the beam splitter; and a detector system constructed and arranged to receive the spatially overlapping reference beam and the transformed beam from the optical arrangement, and to determine a position signal, the detector system comprising:

a polarizing system constructed and arranged to manipulate the polarization of the reference beam and the transformed beam so that they interfere with each other, and to direct the interfering reference beam and the transformed beam to a detector thereby forming an interference pattern; and a detector constructed and arranged to determine a position signal from the interference pattern.

2. A self-referencing interferometer according to claim 1, wherein the beam splitter is a polarizing beam splitter and the referencing system comprises a retarder and a first mirror.

3. A self-referencing interferometer according to claim 1, wherein the transforming system comprises a lens and a second flat mirror.

4. A self-referencing interferometer according to claim 3, wherein the transforming lens is a spherical lens.

5. A self-referencing interferometer according to claim 3, wherein the transforming lens is a cylindrical lens.

6. A self-referencing interferometer according to claim 1, wherein the transforming system comprises a transforming mirror.

7. A self-referencing interferometer according to claim 1, wherein the transforming system comprises an additional beam splitter.

8. A self-referencing interferometer according to claim 1, wherein the detector is arranged to determine a position signal from the variation of intensity of the interfering reference beam and transformed beam in an image plane.

9. A self-referencing interferometer according to claim 1, wherein the detector is arranged to determine a position signal from the variation of intensity of the interfering reference beam and transformed beam in a pupil plane.

10. A self-referencing interferometer according to claim 3, wherein the second flat mirror is at least partially transparent and wherein a focus detection arrangement is provided for use with the part of the transformed beam that passes the at least partially transparent second flat mirror.

11. A self-referencing interferometer according to claim 10, wherein the focus detection arrangement comprises a knife edge positioned with one end at the center of focus of the at least partially transparent second flat mirror and a two-segment detector, wherein the knife edge and the two-segment detector are arranged such that both detector segments receive the same light intensity when the alignment beam is well focused on the mark during use.

12. A self-referencing interferometer according to claim 10, wherein the focus detection arrangement comprises a roof top prism centered in the focus of the at least partially transparent second flat mirror and a four-segment detector, wherein the roof top prism and the four-segment detector are arranged such that all four detector segments receive the same light intensity when the alignment beam is well focused on the mark during use.

13. A self-referencing interferometer according to claim 1, wherein the optical arrangement comprises an objective lens constructed and arranged to direct the alignment beam onto the mark and to capture the diffracted beam resulting from diffraction of the alignment beam by the mark.

14. A self-referencing interferometer according to claim 1, further comprising:

a mirror constructed and arranged to direct the alignment beam onto the mark and to capture the diffracted beam resulting from diffraction of the alignment beam by the mark.

15. A self-referencing interferometer according to claim 1, wherein the direction of the first beam is perpendicular to the direction of the second beam and wherein the referencing system is arranged perpendicular to the direction of the first beam.

16. A self-referencing interferometer according to claim 1 wherein the detector is arranged to determine the position signal from the variation of intensity of the interfering reference beam and transformed beam.

17. A self-referencing interferometer according to claim 1 wherein the detector system is mounted to the optical arrangement.

18. An alignment system comprising at least one self-referencing interferometer according to claim 1.

19. A lithographic apparatus comprising an alignment system according to claim 18.

* * * * *